United States Patent [19]
Igel et al.

[11] Patent Number: 5,890,807
[45] Date of Patent: Apr. 6, 1999

[54] METHOD FOR IDENTIFYING AN APPARATUS OR DEVICE UTILIZING A RANDOMLY PRODUCED CHARACTERISTIC THEREOF

[75] Inventors: Gunter Igel, Emmendingen; Siegfried Heinrich, Bad Krozingen, both of Germany

[73] Assignee: Deutsche ITT Industries GmbH, Freiburg, Germany

[21] Appl. No.: 735,093

[22] Filed: Oct. 22, 1996

[30] Foreign Application Priority Data

Oct. 28, 1995 [DE] Germany .................. 195 40 348.7

[51] Int. Cl.[6] .................. G06K 9/00; G06K 9/46; G06K 9/48
[52] U.S. Cl. .................. 382/100; 382/119; 382/144; 382/145; 382/203; 382/199; 340/825.34
[58] Field of Search .................. 382/100, 115, 382/119, 141, 144, 145, 149, 148, 199, 203, 206, 209, 218; 340/825.34

[56] References Cited

U.S. PATENT DOCUMENTS

| | | | |
|---|---|---|---|
| 4,589,139 | 5/1986 | Hada et al. | 382/144 |
| 4,899,392 | 2/1990 | Merton | 382/136 |
| 5,175,774 | 12/1992 | Truax et al. | 382/145 |
| 5,228,094 | 7/1993 | Villa | 382/218 |
| 5,521,984 | 5/1996 | Denenberg et al. | 382/100 |
| 5,592,561 | 1/1997 | Moore | 382/100 |
| 5,661,816 | 8/1997 | Fantone et al. | 382/100 |

*Primary Examiner*—Bipin Shalwala
*Attorney, Agent, or Firm*—Plevy & Associates

[57] ABSTRACT

A method identifying components is disclosed. Measured values of a randomly produced property of the component are recorded. The measured values are biuniquely assigned to the component by means of a characteristic parameter and the measured values accessibly storing the measured values, or a unique code assigned thereto. Further, the characteristic parameter are accessibly stored.

17 Claims, 2 Drawing Sheets

METHOD FOR IDENTIFYING AN APPARATUS OR DEVICE UTILIZING A RANDOMLY PRODUCED CHARACTERISTIC THEREOF

BACKGROUND OF THE INVENTION

1. Field of the Invention

The present invention relates generally to a method of identifying components and more particularly, to a method of identifying components which prevents the copying of such components.

2. Description of the Prior Art

In order to identify components, codes are impressed on the components. The impression of such a code is necessary in many cases to protect the components from being copied. The applications in which such copy protection is required are steadily increasing, e.g., credit cards, paper money, automotive parts, semiconductor devices. The methods of impressing the codes are becoming increasingly complicated to ensure copy protection.

The requirements for copy protection coding increase as the knowledge of persons who copy the copy protection increases. For example, attempts are being made to impress concealed codes. Furthermore, impression of a code is desirable in many cases to permit subsequent identification of individual components, particularly of their place of origin, the manufacturer, and the date of manufacture. Such coding is further desirable in order to permit identification by retracing the manufacturing process and the like if, for example, the component has been delivered to the customer and is used there or has been fitted into another object.

It is therefore, an object of the present invention, to provide a more reliable method of identifying components.

SUMMARY OF THE INVENTION

A method for identifying components is disclosed, which includes the steps of recording measured values of a randomly produced property of the component, biuniquely assigning the measured values to the component by means of a characteristic parameter, and accessibly storing the measured values, or a unique code assigned thereto, as well as the characteristic parameter.

BRIEF DESCRIPTION OF THE DRAWING

The above objects, further features and advantages of the present invention are described in detail below in conjunction with the drawings, of which.

DETAILED DESCRIPTION OF THE DRAWING

Figure 1:
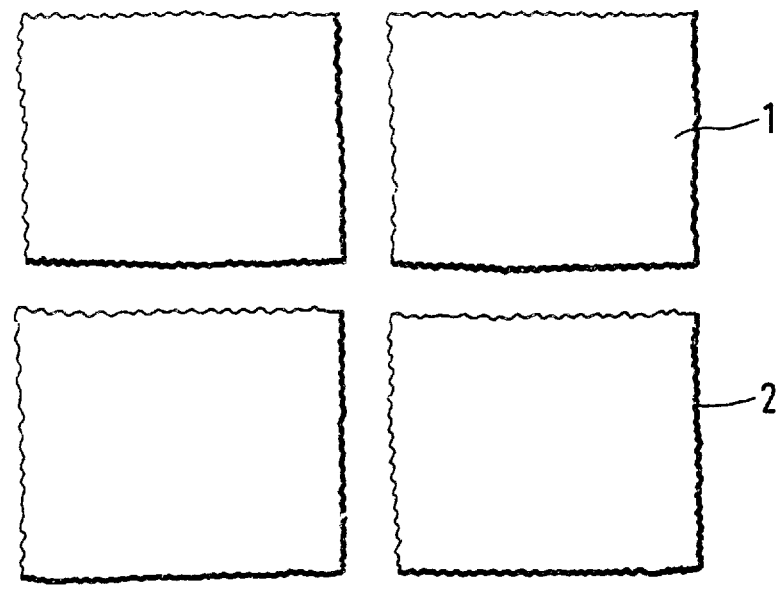
FIG. 1 is a top view of four semiconductor chips separated from each other.

The present invention is directed to a method for for identifying components which prevents the copying of these components. The method according to the present invention includes the steps of recording measured values of a randomly produced property of the component, biuniquely assigning the measured values to the component by means of a characteristic parameter, and accessibly storing the measured values, or a unique code assigned thereto, as well as the characteristic parameter.

Through the use of a randomly produced property of the component for coding purposes, it is ensured that this property is unique to an arbitrary quantity of components. Thus, one component of a plurality of components can be positively and unambiguously identified. Also, a randomly produced property is easy to impress on the component. For instance, a saw track may be formed on metallic objects, such as automotive parts, machines, etc. Since sawing is a random process, the shape of the saw track is random.

If such a property of the component is measured, and the measured values or the code are stored along with the characteristic parameter, access thereto is possible at any time. The stored measured values can be compared with current measured values of a component to be identified. The result of the comparison indicates whether or not the component is the one whose data was stored. Since further data, such as manufacturer, date of manufacture, important data during the manufacturing process and stations traversed by the component, can be stored together with the measured values or the code and the characteristic parameter, important information about the component can be immediately retrieved. In most applications, the randomly produced property of the component cannot be copied, such as a saw track in a solid. This saw track cannot be reproduced in the same form. If the component were copied and the saw track removed, the individual code impressed on the component by the manufacturer would obviously be missing.

Whether it is more advantageous in a particular case to store the measured values themselves or a unique code assigned to the measured values depends on the application. What is important is that the randomly produced property assigned to the component is cataloged in a form in which it can be retrieved if required.

Advantageously, measured values of at least one further randomly produced property of the component are recorded, and the measured values, or a unique second code assigned to the measured values, are accessibly stored together with the characteristic parameter. This makes it possible to further increase the reliability of the method. It is also advantageous to measure at least two properties simultaneously. This results in quick identification of the component.

In a preferred embodiment of the invention, the randomly produced property/properties is/are produced during the manufacture of the component. In that case, additional production steps and production time as well as costs incurred by impressing the code are saved. This is advantageous in the case of all components for which properties are randomly produced during manufacture. It is also advantageous to digitize the measured values, or the respective code assigned thereto, prior to storage. This permits digital storage of the measured values or the code.

In an advantageous embodiment of the invention, the components are semiconductor chips, and the properties are chip properties. During the fabrication of the semiconductor chips, various properties are randomly produced. These properties can be used to identify the individual semiconductor chips. In semiconductor technology it is frequently desirable to be able to trace back the fabrication process of a semiconductor chip. So far this has not been possible, since it is too complicated to impress a code on each chip. The code has hitherto been impressed only on the semiconductor wafer, which contains a plurality of chips, so that this information has been lost after separation of the wafer into the chips. With the method according to the invention, the entire fabrication process of each semiconductor chip and its position on the semiconductor wafer can be stored and retrieved. This is also possible outside the place of manufacture, particularly at the customer.

Advantageously, the chip property used is the contour of at least a portion of the edge of a chip separated from a semiconductor wafer. The contour of the edge of such a semiconductor chip is formed during the separation from the semiconductor wafer. The separating process, like the sawing process, is a random process as regards the formation of the edge contour. With a few billion semiconductor chips placed on the market worldwide, individuality of a chip is ensured by its edge contour. Individuality is also ensured if only a portion of the edge is used. How great this portion must be can be determined by mathematical optimization. This may be appropriate if only a given number of semiconductors are to be distinguished from each other. Use of the entire edge of the component saves the time required for such optimization. Then, the recorded data only need to be reduced by a suitable method, which is no problem with today's computing machines.

Advantageously, the edge contour is measured with an optical camera, particularly a CDD (charge-coupled device) camera. With such a camera, the edge contour can be measured with sufficient accuracy. In addition, a CCD camera is commonly used during the wafer-mounting process anyhow, because, for example, the center between every two semiconductor chips must be determined to separate the chips, or the bonding process is observed. From the time the edge contour of the semiconductor chips is recorded, all process steps of the respective component can then be traced back and unambiguously assigned to the component.

As a chip property, at least part of the color spectrum of the chip can be used. The color of the chip is also a randomly produced property which varies from chip to chip because of the different fabrication steps, the deposited layers and structures, and the thickness distribution of the layers and structures. Whether the entire color spectrum or only a part thereof is measured can be decided from case to case.

It is also possible to use the shape of a portion of a conductive path as a chip property. Both the shape of the conductive path as seen in a top view and the shape of its cross section may be measured. Images of the conductive path must be recorded using a microscope of sufficient resolution, such as an electron microscope. It is also conceivable to use the mask alignment, which is a random process, as a chip property. Advantageously, the positions of the semiconductor chips on the wafer are stored, because this makes it possible to reconstruct the fabrication process of the respective chip.

The measured values, characteristic parameters, codes, and/or positions may be stored in a data base, where they are accessible to any user having access to this data base. This makes it possible to retrieve important data about the fabrication process of a component worldwide.

Referring to FIG. 1, there is shown four semiconductor chips 1 in a top view. The chips 1 have been separated from each other. Each chip 1 has an edge 2, which extends around the periphery of the chip 1. The contour of such an edge 2 was shaped when the chips 1 were separated from the wafer. The separation may have been accomplished by mechanical sawing, for example. As can be seen in the figure, the contour of the edge 2 of each chip 1 is definitely individual. This is due to the fact that the sawing process in a random process. In the figure, the top view of the saw track is shown. This edge contour can be used to unambiguously identify the respective semiconductor chip 1. The contours of the edges 2 of the chips 1 are shown enlarged on a scale of approximately 1:50.

Figure 2:
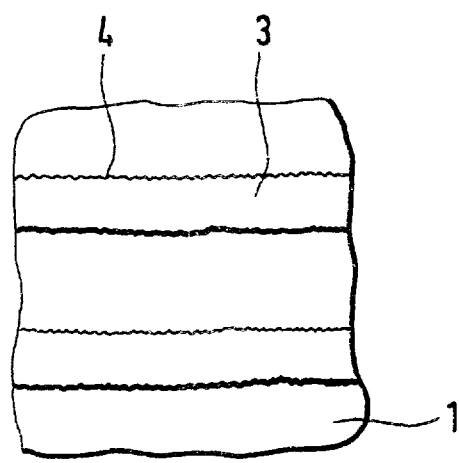
FIG. 2 is a top view of parts of two conductive paths on a semiconductor chip.

Referring to FIG. 2, portions of two conductive paths 3 of a semiconductor chip 1 in a top view is shown. The edges 4 of the conductive paths 3 have contours individual to each chip 1, since they were produced in a random process. Instead of the edge contour as seen in a top view, the cross section of an edge 4 may be used. An edge contour may be randomly produced by undercutting, for example. The edges 4 of the conductive paths 2 are shown on a scale of approximately 1:1000.

The method according to the present invention will now be explained while referencing to FIG. 1. Semiconductor chips 1 associated within a semiconductor wafer are separated from each other as shown . Mounted above the arrangement is a CCD camera with which the center between two adjacent chips 1 to be separated, for example, is determined. During the separating process, an image of the contour of the edge 2 of each chip 1 is taken with the CCD camera. The measured values of each chip are assigned a biunique characteristic parameter. The measured values, which in this case are already available in digitized form, are stored together with the characteristic parameter and other important information about the respective chip, such as its position on the semiconductor wafer and different process steps. Before being stored, the measured values may be compressed in a suitable manner. Instead of the measured values, a unique code may be stored.

Figure 3:
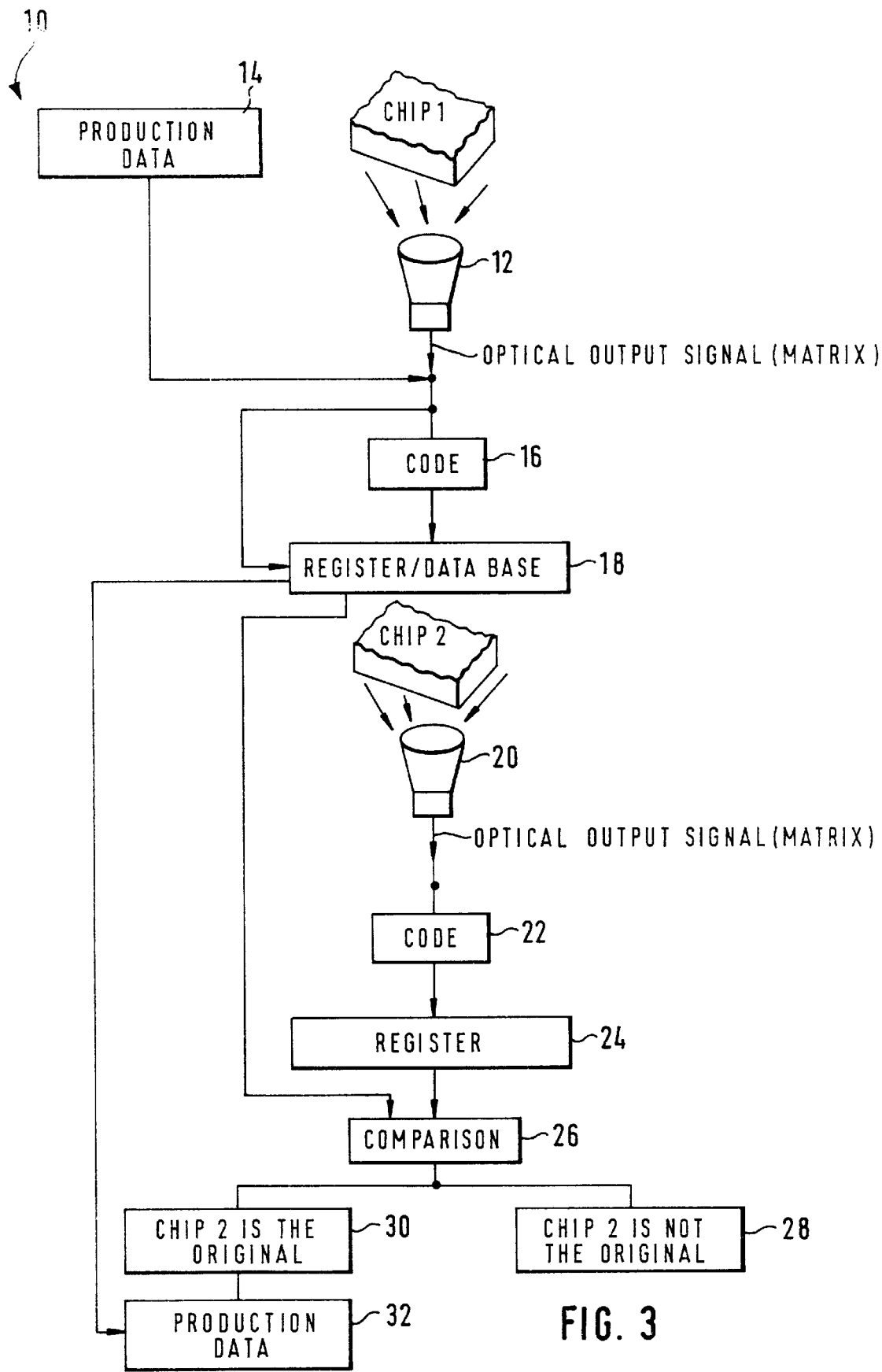
FIG. 3 is a block diagram illustrating the method for identifying components according to the present invention.

Referring to FIG. 3, there is shown a block diagram illustrating the method for identifying components according to the present invention. The method 10 includes utilizing a CCD Camera 12 to take an optical image of a particular chip designated Chip 1, which represents a chip during the initial stage of fabrication. The CCD Camera 12 is utilized to take an optical image of the entire or only a portion of the edge contour of Chip 1. The portion of the edge utilized is determined by a mathematical optimization, which is described in an article entitled DIGITAL IMAGE PROCESSING, by R. C. Gonzales & R. E. Woods, Addison-Wesley Publishing Company, 1992. In this article, various mathematical procedures are discussed for coding images, sampling and processing data.

The CCD Camera 12 produces an optical output signal consisting of data corresponding to Chip 1. This data is further processed before being stored in a register/data base 18. This processing includes adding additional production data 14 related to Chip 1 and producing a code 16. The data corresponding to Chip 1, production data 14 and code 16 are then all stored as previously described in the register/data base 18 where it can be recalled in order to verify the identity of a chip, which is designated by Chip 2.

Chip 2 represents a chip after being fabricated, where it is desired to verify the identity in order to prevent copying of such devices. An optical image of Chip 2 is also taken utilizing a CCD Camera 20. The optical image is taken utilizing the same methods as described in regard to Chip 1. The CCD camera 20 again produces an optical output signal consisting of data corresponding to Chip 2. The data corresponding to Chip 2 along with a code 22 is stored in another register 24.

In order to determine if Chip 2 is authentic, a comparison 26 is performed which includes comparing the contents of both registers 18, 24. If the data in both registers 18, 24 is identical, Chip 2 is identified as an original 30 corresponding to Chip 1. After Chip 2 is identified as original 30, the corresponding production data 32 can be retrieved from the first register/data base. If the data in both registers 18, 24 differs, Chip 2 is not the original one 28 corresponding to Chip 1. This procedure can be repeated for additional chips by retaining the data corresponding to Chip 1 in the register/data base 18.

While the invention has been particularly shown and described with reference to preferred embodiments thereof, it will be understood by those skilled in the art that changes in form and details may be made therein without departing from the spirit and scope of the present invention.

What is claimed:

1. A method for identifying a device in order to prevent copying thereof, said method comprising the steps of:

measuring a saw-track of said apparatus to be identified in order to produce a measured value;

recording said measured value;

assigning a characteristic parameter to said measured value which is associated with the object to be identified; and storing said measured value along with said characteristic parameter in an accessible manner which enables the object to be identified by comparing a current measured value of the object to said stored measured value.

2. A method for identifying a particular semiconductor device in order to prevent copying, said method comprising the steps of:

measuring a randomly produced property of the semiconductor device to be identified in order to produce a measured value, wherein said randomly produced property is selected from the group consisting of at least a portion of a contour of an edge, a color spectrum, a shape of the conductive path and a mask alignment;

recording said measured value;

assigning a characteristic parameter to said measured value which is associated with the object to be identified; and storing said measured value along with said characteristic parameter in an accessible manner which enables the semiconductor device to be identified by comparing a current measured value of the semiconductor device to said stored measured value.

3. The method of claim 1, wherein said characteristic parameter is unique to the object being identified.

4. The method of claim 1, which further includes measuring a second randomly produced property in order to produce a second measured value, assigning said second measured value to said characteristic parameter and then storing said second measured value.

5. The method of claim 4, wherein said saw track and said second randomly produced property are stored simultaneously.

6. The method of claim 1, wherein said measured value is stored by first converting said measured value into a unique code and then storing said unique code.

7. The method of claim 1, wherein said measured value is digitized before being stored.

8. The method of claim 1, wherein said saw track is produced during the manufacturing of the object to be identified.

9. The method of claim 1, which further includes storing additional data along with said measured value and said characteristic parameter such as a name of the manufacturer, date of manufacture, manufacturing process and manufacturing stations traversed by the object.

10. The method of claim 8, wherein the object to be identified is a metallic object.

11. The method of claim 8, wherein the object to be identified is a semiconductor device.

12. The method of claim 2, wherein said contour of an edge of the semiconductor device is formed when the semiconductor device is separated from the wafer.

13. The method of claim 12, wherein only a portion of the edge of the semiconductor is utilized.

14. The method of claim 12, wherein said contour of the edge is measured by an optical camera.

15. The method of claim 2, wherein said shape of conductive path is recorded by a microscope.

16. The method of claim 11, which further includes storing additional data along with said measured value and said characteristic parameter such as the position on the wafer or process steps associated with the semiconductor device to be identified.

17. The method of claim 16, wherein said additional data along with said measured value and said characteristic parameter are stored in a computer data base.

* * * * *